(12) United States Patent
Ding et al.

(10) Patent No.: US 9,651,751 B1
(45) Date of Patent: May 16, 2017

(54) COMPACT OPTICAL TRANSCEIVER BY HYBRID MULTICHIP INTEGRATION

(71) Applicant: INPHI CORPORATION, Santa Clara, CA (US)

(72) Inventors: Liang Ding, Singapore (SG); Radhakrishnan L. Nagarajan, Santa Clara, CA (US); Roberto Coccioli, Westlake Village, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/067,125

(22) Filed: Mar. 10, 2016

(51) Int. Cl.
*G02B 6/12* (2006.01)
*G02B 6/42* (2006.01)
(Continued)

(52) U.S. Cl.
CPC ......... *G02B 6/428* (2013.01); *G02B 6/12002* (2013.01); *G02B 6/1225* (2013.01); *G02B 6/13* (2013.01); *G02B 6/43* (2013.01); *H01L 23/49827* (2013.01); *H01L 24/17* (2013.01); *H01L 24/81* (2013.01); *H01L 25/167* (2013.01); *H01S 5/02248* (2013.01); *H01S 5/02276* (2013.01); *H04B 10/40* (2013.01); *H05K 1/0274* (2013.01); *H05K 1/181* (2013.01); *H05K 3/3436* (2013.01); *G02B 2006/12061* (2013.01); *G02B 2006/12085* (2013.01); *G02B 2006/12123* (2013.01); *G02B 2006/12142* (2013.01); *H01L 2224/16057* (2013.01); *H01L 2224/16225* (2013.01); *H01L 2224/1712* (2013.01);
(Continued)

(58) Field of Classification Search
CPC .. G02B 6/428; G02B 6/12002; G02B 6/1225; G02B 6/13; G02B 6/43; G02B 2006/12061; G02B 2006/1208; H01L 23/49827; H01L 24/17; H01L 24/81; H01L 25/167; H01S 5/02248; H01S 5/02276; H04B 10/40; H05K 1/0274; H05K 1/181; H05K 3/3436
USPC .................................... 385/14; 257/777–784
See application file for complete search history.

(56) References Cited

U.S. PATENT DOCUMENTS 8,080,445 B1 * 12/2011 Pagaila ............. H01L 23/49827
257/E21.499
8,531,012 B2 * 9/2013 Lee ..................... H01L 21/4857
257/660
(Continued)

FOREIGN PATENT DOCUMENTS

EP 2639978 A1 * 9/2013 ........... H04B 10/801

*Primary Examiner* — Ellen Kim
(74) *Attorney, Agent, or Firm* — Richard T. Ogawa; Ogawa P.C.

(57) ABSTRACT

A compact optical transceiver formed by hybrid multichip integration. The optical transceiver includes a Si-photonics chip attached on a PCB. Additionally, the optical transceiver includes a first TSV interposer and a second TSV interposer separately attached nearby the Si-photonics chip on the PCB. Furthermore, the optical transceiver includes a driver chip flip-bonded partially on the Si-photonics chip through a first sets of bumps and partially on the first TSV interposer through a second sets of bumps. Moreover, the optical transceiver includes a transimpedance amplifier module chip flip-bonded partially on the Si-photonics chip through a third sets of bumps and partially on the second TSV interposer through a fourth set of bumps.

22 Claims, 5 Drawing Sheets

(51) Int. Cl.
*G02B 6/122* (2006.01)
*G02B 6/43* (2006.01)
*G02B 6/13* (2006.01)
*H01L 23/498* (2006.01)
*H01L 25/16* (2006.01)
*H01L 23/00* (2006.01)
*H05K 1/02* (2006.01)
*H05K 1/18* (2006.01)
*H05K 3/34* (2006.01)
*H01S 5/022* (2006.01)
*H04B 10/40* (2013.01)

(52) U.S. Cl.
CPC ........... *H01L 2224/81191* (2013.01); *H01L 2924/10253* (2013.01); *H01L 2924/12042* (2013.01); *H01L 2924/12043* (2013.01); *H01L 2924/14* (2013.01); *H01L 2924/1425* (2013.01); *H01L 2924/1426* (2013.01); *H01L 2924/19041* (2013.01); *H01L 2924/19105* (2013.01); *H01L 2924/2064* (2013.01); *H05K 2201/10121* (2013.01); *H05K 2201/10151* (2013.01); *H05K 2201/10378* (2013.01)

(56) References Cited

U.S. PATENT DOCUMENTS

| | | | |
|---|---|---|---|
| 8,587,132 B2* | 11/2013 | Zhao | H01L 24/17 257/686 |
| 2002/0113320 A1* | 8/2002 | Akram | H01L 23/49822 257/778 |
| 2014/0075076 A1* | 3/2014 | Pillai | G06F 13/14 710/305 |
| 2016/0072651 A1* | 3/2016 | Welch | H04B 10/00 375/286 |
| 2016/0156087 A1* | 6/2016 | Baba | H01P 3/06 333/238 |

* cited by examiner

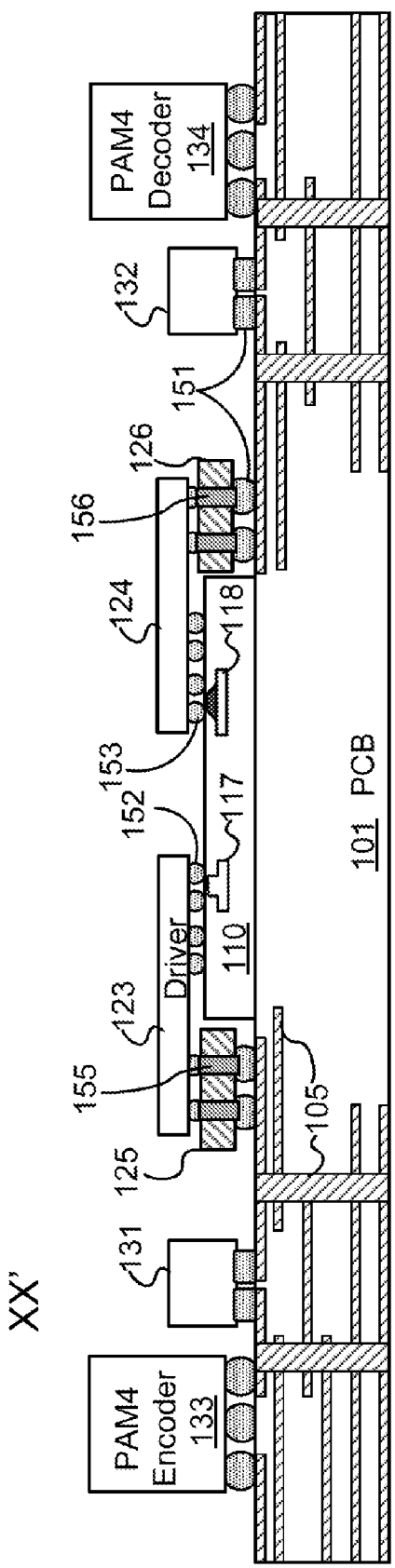
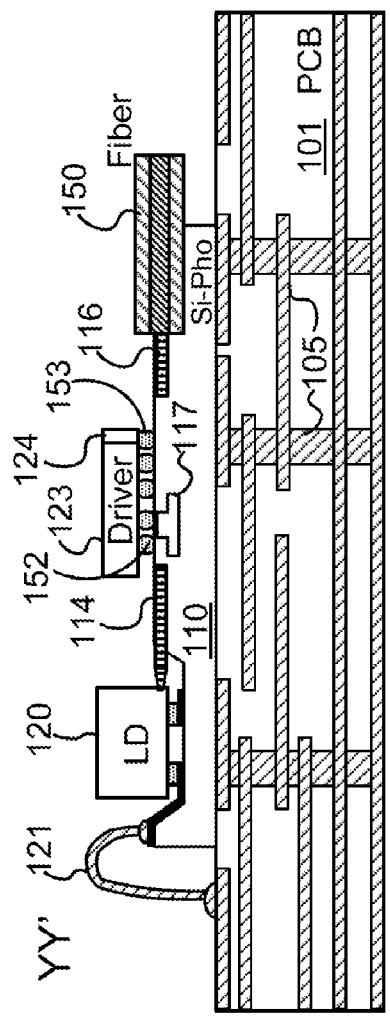
FIG. 2
FIG. 3

COMPACT OPTICAL TRANSCEIVER BY HYBRID MULTICHIP INTEGRATION

CROSS-REFERENCE TO RELATED APPLICATIONS

N/A

BACKGROUND OF THE INVENTION

The present disclosure is related to a photonic transceiver design and manufacture, more particularly, to a compact optical transceiver based on silicon photonics using 3-dimensional hybrid multichip stacking without wire bonds and method of making the same.

As science and technology are updated rapidly, processing speed and capacity of the computer increase correspondingly. The communication transmission or reception using the traditional cable is limited to bandwidth and transmission speed of the traditional cable and mass information transmission required in modern life causes the traditional communication transmission overload. To correspond to such requirement, the optical fiber transmission system replaces the traditional communication transmission system gradually. The optical fiber communication is chosen for systems requiring higher bandwidth and longer distance that electrical cable cannot accommodate. Present electronic industrial performs research toward optical transmission which will become the mainstream in the future even for short distance communication. Said optical communication is a technology in that light wave functions as signal carrier and transmitted between two nodes via the optical fiber. An optical communication system includes an optical transmitter and an optical receiver. By the optical transceiver, the received optical signal can be converted to an electrical signal capable of being processed by an IC, or the processed electrical signal can be converted to the optical signal to be transmitted via optical fiber. Therefore, objective of communication can be achieved.

With the advances of optical communication technology and applications driven by the market, the demands become stronger on increasing bandwidth for optical communication and decreasing package footprint of an optical transceiver. It is more and more challenging to integrate all necessary components within smaller and smaller module package. For the state-of-art optical transceiver products, all the critical components including clock data recovery (CDRs), modulator drivers, transimpedance amplifiers (TIAs), and photonics chips having optical passives, modulators, and photo detectors, are assembled side-by-side on a PCB in a 2D fashion. This approach has at least two drawbacks for developing any future optical transceiver with data rate greater than 400G. Firstly, the side-by-side placement of the components consumes much of the board area for optical transceiver as a pluggable product or major substrate area for on-board optics product, making it very difficult to further shrink the product size. Secondly, side-by-side placement on the PCB creates longer electrical transmission length and often requires wirebonds between electrical die and photonics die, introducing more electrical loss which damages signal integrity for very high data rate transceiver product, e.g., >56 G baud symbol rate. In particular, the wirebonds lead to impedance mismatch due to large inductance, degrading the signal a lot at higher frequencies. As such, it is not practical to use wirebond as electrical interconnect between chips or between chips and board for the applications where high frequency (e.g., >40 GHz) analog signal is transmitted. The large inductance of wirebonds has become a bottle neck of high speed signal transmission.

Driven by the desire to seek perfect integration of electronics and photonics for making ever compact high speed optical transceiver, Luxtera, Inc of California has been able to provide a monolithic integration on a single chip achieving possibly lowest parasitic between electronics and photonics. However, the complexity of manufacturing process, low yield, inefficient wafer area usage, and very expensive in scaling to advanced electronics making it impractical as a field product. Therefore, there is demand on alternative solutions using multi-chip integration by decoupling partially photonics, electronics, and TSV/TGV interposer processes while still achieving substantially low parasitic between driver/TIA and Si photonics devices with high yield, efficient wafer area usage, and flexible scaling options.

BRIEF SUMMARY OF THE INVENTION

The present disclosure is related to integrated photonic transceiver, more particularly, a high-speed compact optical transceiver formed by hybrid multi-chip integration based on high-yield silicon photonics with die-stacked driver coupled by passive TSV interposers that are formed in separate silicon or glass substrate. In certain embodiments, the invention is applied for high speed optical communication, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

Serial link performance is limited by the channel electrical bandwidth and the electronic components. In order to resolve the inter-symbol interference (ISI) problems caused by bandwidth limitations, we need to bring all electrical components as close as possible to reduce the distance or channel length among them. Monolithic integration of photonics and electronics (e.g., see U.S. Pat. No. 8,895,413) promises a one-time boost in their capabilities. The patent by Luxtera discloses two monolithic ways to integrate Si photonics and high speed electronics, i.e., side-by-side integration and 3D integration using through-Si-via (TSV) embedded in electronics part. Indeed, these two methods introduces much lower parasitic between electronics and photonics than what wire bond method provides. However, the process is very expensive and production yield is low due to the extreme complexity of the manufacturing process. In system point of view, there is another drawback, i.e., wirebonding is still needed between electronic circuits and PCB or package substrate. Therefore, there is no improvement in electrical signal transmission from PCB or package substrate to electronics circuits or vice versa. An alternative way to achieve advanced integration with high yield is to use multiple chip integration technology. In this application, we will disclose a high speed compact optical transceiver using electrical/optical die-stacking integration via separately fabricated TSV/TGV interposers as well as a staggered bump arrangement with optimized pitch size.

In a specific embodiment, the present invention provides an optical transceiver by hybrid multichip integration. The optical transceiver includes a Si-photonics chip attached on a PCB. The optical transceiver further includes a first TSV interposer and a second TSV interposer separately attached nearby the Si-photonics chip on the PCB. Additionally, the optical transceiver includes a driver chip flip-bonded partially on the Si-photonics chip through a first sets of bumps and partially on the first TSV interposer through a second sets of bumps. Furthermore, the optical transceiver includes a transimpedance amplifier module chip flip-bonded partially on the Si-photonics chip through a third sets of bumps and partially on the second TSV interposer through a fourth set of bumps.

In an alternative embodiment, the present invention provides a method for assembling a compact optical transceiver by hybrid multi-chip integration. The method includes providing a Si-photonics chip comprising at least multiple optical passives, modulators, and photo diodes embedded below a top surface thereof. The method further includes disposing the Si-photonics chip on a PCB while having the top surface configured with at least multiple first conductive pads and second conductive pads respectively coupled to the modulators and photo diodes. The method further includes disposing a first TSV interposer and a second TSV interposer respectively bonded on two portions of the PCB substantially nearby the Si-photonics chip. The first or second TSV interposer has respective bond pads facing up. Additionally, the method includes providing a driver module chip with a first set of bumps and a second set of bumps being pre-fabricated on front surface thereof. Furthermore, the method includes flipping the driver module chip with the first set of bumps and the second sets of bumps facing down respectively bonded onto the multiple first conductive pads and corresponding bond pads of the first TSV interposer without any wire bonds. The method further includes providing a transimpedance amplifier module chip with a third set of bumps and a fourth set of bumps being pre-fabricated on front surface thereof. Moreover, the method includes flipping the transimpedance amplifier module chip with the third set of bumps and the fourth set of bumps facing down respectively bonded on the multiple second conductive pads and corresponding bond pads of the second TSV interposer without any wire bonds.

Many benefits are provided with the improvement according to the present invention. In certain embodiments, the present invention provides a hybrid multichip stacking integration to assemble a compact optical transceiver with substantially similar low parasitic capacitance of interconnection but with much lower cost compared to one using a monolithic integration. By decoupling processes for photonics, electronics, and interposer, much higher yield can be achieved for each component and higher reliability for the transceiver as a whole. Additionally, the assembly process proposed in this invention leads to more efficient usage of wafer area of advanced electronics node, making it a more flexible choice of process node for electronics, i.e., driver and TIA module and flexible integration with photonics and electronics IPs from different vendors. The present invention achieves these benefits and others in the context of broadband communication technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 2 is a diagram showing cross-sectional XX' cut view of the optical transceiver assembly of FIG. 1 according to the embodiment of the present invention.

FIG. 3 is a diagram showing cross-sectional YY' cut view of the optical transceiver assembly of FIG. 1 according to the embodiment of the present invention.

DETAILED DESCRIPTION OF THE INVENTION

The present disclosure is related to a photonic transceiver manufacturing process, more particularly, to a high-speed compact optical transceiver formed by hybrid multichip integration based on high-yield silicon photonics with stacked driver coupled by separately fabricated passive TSV interposer. In certain embodiments, the invention is applied for high speed optical communication, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1:
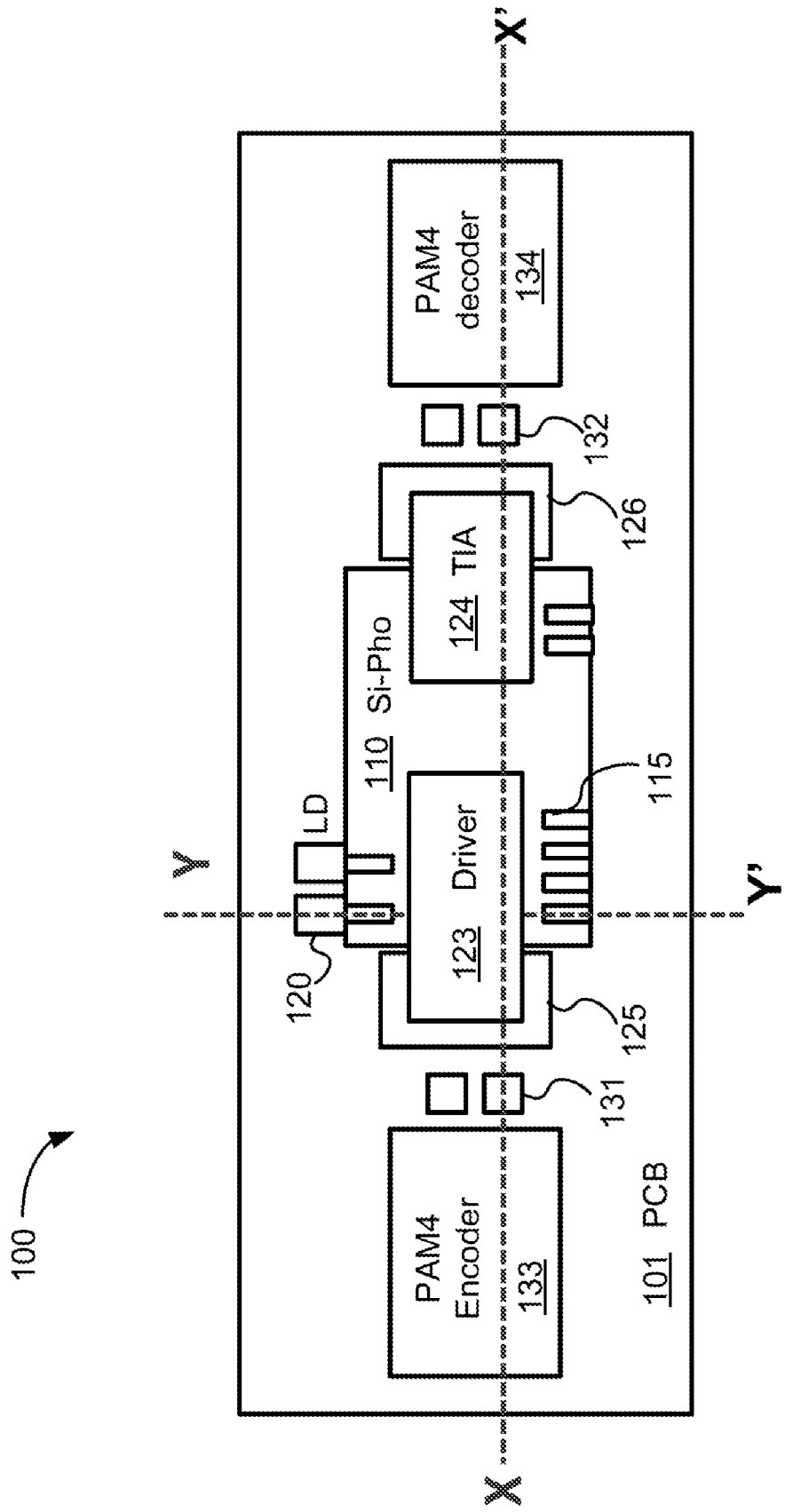
FIG. 1 is a top view of an optical transceiver packaged on a PCB according to an embodiment of the present invention.

FIG. 1 is a top view of an optical transceiver packaged on a PCB according to an embodiment of the present invention. This diagram is merely an example, which should not unduly limit the scope of the claims. One of ordinary skill in the art would recognize many variations, alternatives, and modifications. As shown, a compact optical transceiver 100 based on architecture designed for >56G baud operation is formed on a PCB or an organic substrate 101. A major component of the optical transceiver 100 is a Si-photonics die or chip 110, including all optical passive components, modulators, photo diodes, mounted in central area of the PCB 101. Other components of the optical transceiver 100 include a PAM4 encoder 133 and a PAM4 decoder 134 respectively disposed near two end regions of the PCB 101. Next to the PAM4 encoder 133 and PAM4 decoder 134, a couple AC coupling capacitors 131 and 132 are disposed. A modulator driver 123 and a trans-impedance amplifier (TIA) 124, according to a specific embodiment, are stacking partially over the Si-photonics die 110 respectively via two through-silicon via (TSV) interposers, 125 and 126, respectively disposed beyond two opposite edges of Si-photonics die 110 on the PCB 101. Alternatively, when a glass substrate is used, a through-glass via (TGV) interposer may be served having the same interconnection function. One or more laser diodes 120 are coupled to the Si-photonics die 110 to have the laser light being guided through Si-waveguides (not shown) in the Si-photonics die 110 and coupled to optical fibers supported by pre-fabricated V-grooves 115. For simplifying the description, other components including microcontrollers, power management ICs, and other passive optical components are not shown in the schematic diagram of FIG. 1. Additional features of the assembly structure of the compact optical transceiver 100 can be found in cross sectional cut views shown below.

FIG. 2 is a diagram showing cross-sectional XX' cut view of the optical transceiver assembly of FIG. 1 according to the embodiment of the present invention. This diagram is merely an example, which should not unduly limit the scope of the claims. One of ordinary skill in the art would recognize many variations, alternatives, and modifications. As shown in this XX' cut view, for all components mounted on the PCB 101, wire bonds electrical connections are substantially eliminated. Instead, electrical connections between PCB 101 and input of driver 123 or output of TIA 124 and PCB 101 are achieved through TSVs 155 and 156 and solder bumps 151 on the surface of the PCB 101. The electrical connections between driver 123 and modulator 117 and between photo diode 118 and TIA 124 are achieved through micro-bumps. Only Laser diodes (LD) 120 mounted on the Si-photonics die 110 is using wire bonds for DC current injection. The wirebonds-free assembly scheme makes the architecture capable of delivering >56G baud symbol rate, and thus capable of delivering 112 Gbps with PAM4 signal modulation format.

In an alternative embodiment, the optical transceiver 100 includes a compact assembly scheme with Driver 123 and TIA 124 being stacked on top of Si photonics die 110 to save package area of PCB 101. In particular, the chips of Driver module 123 and TIA module 124 are partially stacked over the Si-photonics die 110 and the PCB 101. A portion of the chip of Driver module 123 or TIA module 124 is coupled by flipped bonding via solder bumps 152 or 153 on the Si-photonics die 110 without using trans-silicon vias (TSV) connection. In a specific embodiment, the flipped bonding between Driver module 123 or TIA module 124 and the Si-photonics die 110 includes design optimiztion of bumps 152 or 153. The optimization includes bump size, staggered arrangement, and optimized pitch distances in 2-dimensional directions. In an alternative specific embodiment, a TSV interposer 125 or 126 fabricated separately in a silicon substrate, instead of directly through the Si-photonics die, is used to connect the Driver module 123 or TIA module 124 to the PCB 101. Although the TSV used in Si-photonics die may indeed enhance the performance of optical transceiver, the manufacture complexity and reliability issue make it too costly and less attractive for scaling up in mass production.

Si photonics die 110 is made using a SOI wafer. It is difficult to make TSVs in SOI wafer because etching thick Si oxide (6-10 μm) and 100-200 μm Si for forming a via of straight profile to be filled with Cu is very difficult to achieve. Additionally, if a Si photonics wafer has suspended optical coupler structure, it is very fragile when performing a TSV backside process and post-backside process, resulting in very low production yield or high-cost manufacturing. In order to have TSVs fabricated with photonics device together in a single chip, the TSV-caused stress will have impact on the optical device performance, e.g., the MUX and DeMUX center wavelength. The safe zone of TSV placement is unknown so far. Furthermore, so far the industry has no or very few design rule study on TSV through thick SOI wafer, TSV processes may cause Si cracking in high temperature assembly process, e.g., a range of 260° C.-300° C. during a bump bonding process. This introduces severe reliability issue of the optical transceiver product. By separating TSV fabrication from the Si-photonics die 110 as shown in FIG. 2, the manufacturing difficulties for both Si photonics die 110 and TSV interposer 125 (or 126) have been decoupled so that high yield for both the Si photonics die 110 and passive TSV or TGV interposer 125 (126) can be achieved.

Referring to FIG. 2, the TSV or TGV interposer 125 (126) is fabricated using a separate silicon or glass substrate where straight profile via with proper depth can be readily formed using standard CMOS technology without any manufacture concerns or issues in associated with the SOI wafer or particularly Si-photonics die including one or more embedded fragile passive optical components. The silicon substrate should use high-resistance Si wafer or glass substrate can be used. In each straight profile via Cu filling can be done and a bond pad can be added to cap each end of the filled Cu or other conductive material. Then, properly configured TSV (TGV) interposer 125 or 126 with filled Cu 155 and bond pads (not visible) can be diced out of the processed Si or Glass substrate and transferred to the surface of PCB 101, where the TSV (TGV) interposer 125 or 126 has a bottom bond pad to be soldered with to a bigger solder bump for connecting with PCB interconnection while a top bond pad to be coupled with a smaller bump pre-fabricated on a front surface of Driver module 123 or TIA module 124 which is flipped upside down for forming die-to-interposer electrical connection.

Referring again to FIG. 2, a modulator 117 driven by the Driver module 123 for modulating laser light produced by the LD 120 is formed inside the Si-photonics die 110. Also one or more photo diodes 118 for converting optical signals into analog electrical signals for TIA module 124 are formed inside the Si-photonics die 110. Alternatively, the connection between the Driver module 123 or TIA module 124 and modulator 117 or photo diodes 118 can be formed using surface flipped bonding using optimized under bump design to achieve substantially high performance capable of delivering >56G baud symbol rate, without need to use costly TSV through the Si photonics wafer.

FIG. 3 is a diagram showing cross-sectional YY' cut view of the optical transceiver assembly of FIG. 1 according to the embodiment of the present invention. This diagram is merely an example, which should not unduly limit the scope of the claims. One of ordinary skill in the art would recognize many variations, alternatives, and modifications. As shown, the cut view along YY' line illustrates particularly the laser diode 120 mounted on the surface of Si-photonics die 110. The laser diode 120 is still using wire bonds 121 to provide external DC current injection for driving the laser source. This wire bond 121 will not impact the high-frequency transmission but providing only DC power. But the Si-photonics die 110 with no other wire bonds out of its surface except those for mounting laser diodes 120 includes other passive optical components such as suspended coupler 116, modulator 117, or photo diodes 118 fully embedded in the SOI chip. The electrical components like Driver module 123 or TIA module 124 is only partially stacked over the Si-photonics die 110 by coupling bumps 152 or 153 prefabricated on the front surface of the top die (i.e., a Driver module 123 or a TIA module 124) flipped over to under bump metallization spot of conductive pad formed on the top surface of bottom die (i.e., a Si-photonics die 110). Also shown, laser light should be coupled from the LD 120 into silicon waveguides (not shown) through the suspended couplers 114. Similarly, optical fibers 150, supported by V-grooves (not shown) on the other end of the Si-photonics die 110, couple the laser light into/out from waveguide via different suspended couplers 116 to deliver incoming/outgoing optical signals.

In an alternative embodiment, the present invention also provides a method for assembling a compact optical transceiver by illustrating a few key processes based on a multi-chip stacking scheme with separately fabricated TSV or TGV interposer and optimized under bump design. FIGS. 4A-4D are diagrams showing a series of processes for making a compact optical transceiver on one side of the PCB having embedded interconnections according to an embodiment of the present invention. These diagrams are merely examples, which should not unduly limit the scope of the claims. One of ordinary skill in the art would recognize many variations, alternatives, and modifications. One or more processes may be skipped by the illustration of just four snap shots of the whole assembly processes. One of the existing or additionally processes may be inserted in more than single sequential orders. Other processes may be included upon minor changes in components while not affecting the main sequence of the assembly process.

Figure 4A:
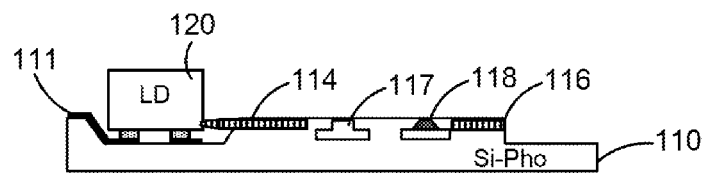
FIGS. 4A-4D are diagrams showing a series of processes for making a compact optical transceiver on the PCB according to an embodiment of the present invention.

Referring to FIG. 4A in a cross-sectional view, a Si-photonics die 110 including pre-fabricated suspended couplers 114 and 116, modulator 117, photo diodes 118 and electrical connection pads 111 on top surface for mounting laser diodes, is provided. Other passive optical components may be included too but not shown explicitly here for simplifying description. Upon the providing of the Si-photonics die 110, one or more laser diodes 120 can be installed on to the Si-photonics die 110 by surface mounting or flipped bonding on a conduction pad formed on the surface of the Si-photonics die 110. The laser diode 120 output port is coupled to a Si waveguide (not shown explicitly) inside the chip via a suspended coupler 114. The suspended coupler 116 is designed for coupling optical fiber. The modulator 117 is configured to couple a driver by (partial) stacking the driver over the top surface of the Si-photonics die 110 and so is configured for photo diodes 118 to couple with a TIA module 124. Upon the projected assembly processes, certain bonding UBM (under bump metallization) sites for respectively coupling top dies of driver module and TIA module are prefabricated on respective locations of the top surface of the Si-photonics die 110.

Figure 4B:
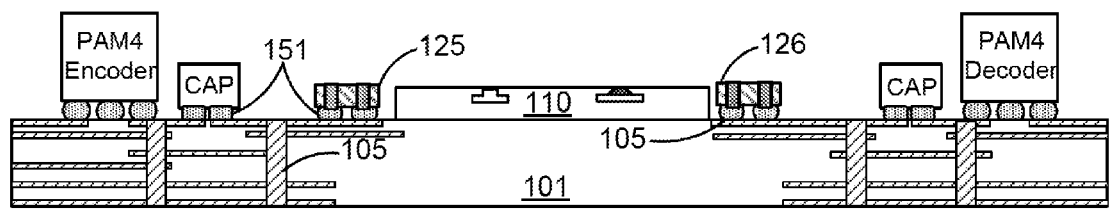

Referring to FIG. 4B in a cross-sectional view, the Si-photonics die 110 plus the mounted laser diodes 120 is disposed on the PCB 101. In an embodiment, the Si-photonics die 110 is disposed in substantial central region of the PCB 101. Additionally, other components including PAM4 encoder/decoder, multiple capacitors (CAP), and at least a pair of TSV interposers 125 and 126 (and other ICs not shown) are bonded at respective contact spots prefabricated on the PCB 101. The bonding of these components on the PCB 101 is performed by soldering using bigger sized bumps 151 connected to interconnection lines 105 inside the PCB organic substrate.

The TSV interposer 125 or 126 is fabricated in a separate Si substrate (or is called TGV interposer if a glass substrate is used) by etching one or more vias with straight profile through the whole substrate thickness and subsequently filling Cu in the each via with two ends being respectively capped by two bond pads. The bond pads (not explicitly shown) on top end are served as under bump metallization spots ready for coupling flipped bumps of top dies such as Driver module 123 and TIA module 124 in subsequent process. In an embodiment for the TSV interposer 125 or 126, each via is configured with a dimension as small as 20 μm in diameter and 100 μm in length. This is much reduced in size compared to wire bond length of at least 400 μm based on state-of-art mass production capability, thus providing much wider bandwidth extended over 100 GHz from about 70 GHz with wirebonding. To achieve best performance of the TSV interposer, high resistivity Si substrate is preferred.

Figure 4C:
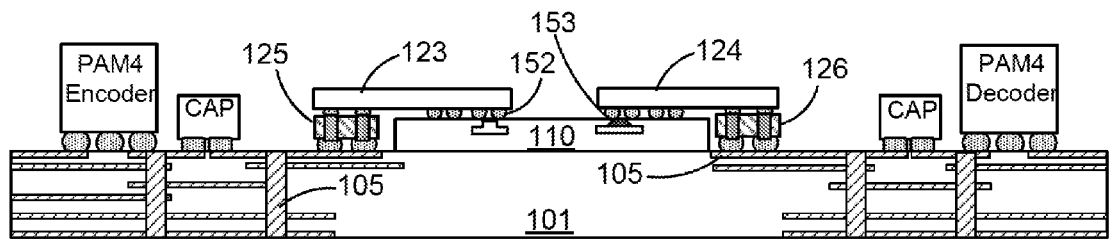

Referring to FIG. 4C, following the same cross-sectional view of FIG. 4B, a Driver module 123 as a separate die is flipped to bond partially with the Si-photonics die 110 and partially with the TSV interposer 125. The die-to-die bonding is achieved by soldering smaller bumps 152 pre-fabricated on the Driver module 123 at top to UBMs of Si-photonics die 110 at bottom. The Die-to-interposer bonding is also formed by soldering separate bumps 152 (pre-fabricated on the front surface of driver module 123 which is flipped to have the bumps 152 facing down) to connect directly to a bond pad capped on the filled Cu in the TSV interposer 125. Similarly, the TIA module 124 is served as a top die and is flipped with some of multiple bumps 153 pre-fabricated on its front surface facing down to bond with conductive pads on top surface of the Si-photonics die 110 and some others of multiple bumps 153 formed on the front surface facing down to bond with respective bond pads of the TSV interposer 126. The die-to-die bonding is achieved by soldering the bumps 153 attached on the TIA module 124

(top die) to UBMs of Si-photonics die 110 (bottom die). Similarly, the Die-to-interposer bonding is achieved by soldering other bumps 153 on the TIA module 124 directly to respective bond pads connected to the filled Cu in the TSV interposer 126. Although the TSV interposer 125 is not formed directly through the Si-photonics die 110 as in some reported application, instead, is placed as a separate component outside but nearby the Si-photonics die 110 for providing electrical connection between PCB interconnection and the Driver module 123 to control the modulator formed insider the Si-photonics die 110. Another TSV or TGV interposer 126 similarly provides electrical connection between the PCB 101 and the TIA module 124 to support analog to digital conversion and other data processing functions of TIA module 124 that is partially flip-bonded to the Si-photonics die 110.

Figure 4D:
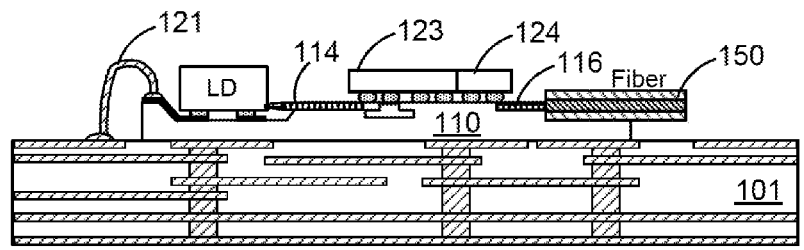

Referring to FIG. 4D in an alternative cross-sectional view, after stacking separate top dies of Driver 123 and TIA module 124 partially onto the Si-photonics die 110 and partially onto respective TSV interposers 125 and 126 fabricated from separate Si or Glass substrate independent of the formation of Si-photonics die 110, each of alternative conduction pads on the Si-photonics die 110 for mounting the Laser diodes 120 is connected by wire bond 121 to receive DC current injection for generating laser. One or more output ports of the Laser diodes 120 can be coupled to suspended couplers 114 pre-fabricated in the Si-photonics die 110. Additional assembly processes for forming the compact optical transceiver include attaching one or more optical fibers 150 to several V-grooves formed near an edge of the Si-photonics die 110. Each of the one or more optical fibers 150 is coupled to a corresponding suspended coupler 116 pre-fabricated in the Si-photonics die 110.

In a specific embodiment, the present invention provides an optimized bump design for reducing capacitance of bumps and associated conductive pads that bond the top die for Driver or TIA module and bottom die for Si-photonics chip. Smaller bump size naturally results in smaller capacitance for providing greater bandwidth of the interconnection (of the optical transceiver). For example, it has been seen in an R&D lab, 20 μm bump diameter is doable. But for mass production, the bump size is preferred to be larger than that, e.g., 50 μm in order to achieve reasonable yield. The bump design of the present invention includes several features that achieve higher performance of smaller bump using bump diameter as large as 50 μm in an optimized arrangement as illustrated in following figures.

Figure 5A:
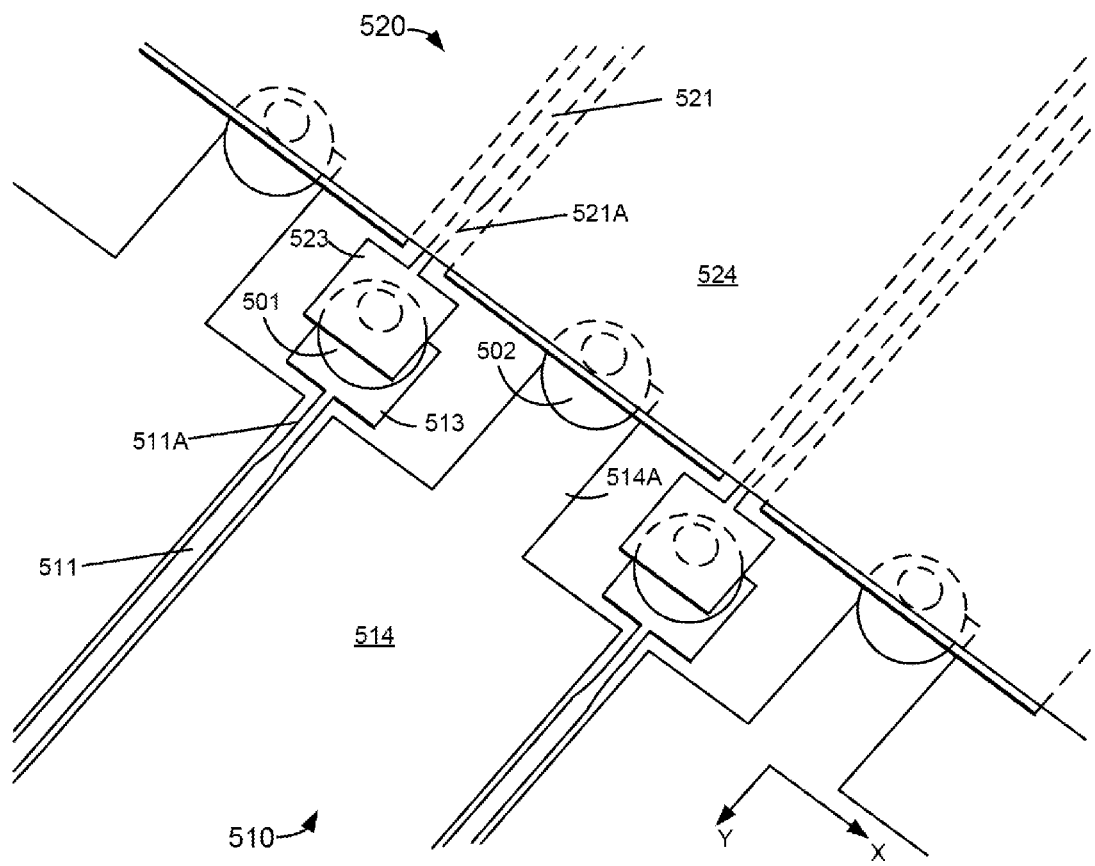
FIG. 5A is a diagram showing staggered bump arrangement according to an embodiment of the present invention.
Figure 5B:
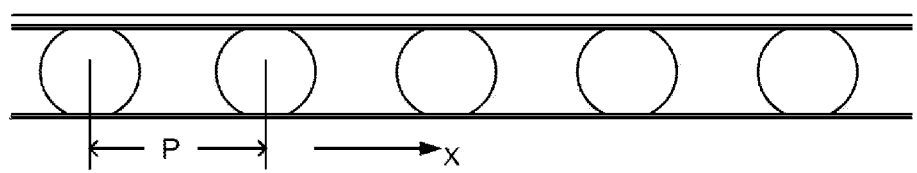
FIG. 5B is a side view of the staggered bumps with optimized pitch P according to an embodiment of the present invention.

FIG. 5A is a diagram showing staggered bump arrangement according to an embodiment of the present invention. This diagram is merely an example, which should not unduly limit the scope of the claims. One of ordinary skill in the art would recognize many variations, alternatives, and modifications. As shown, in a perspective view, top die 520 is bonded to bottom die 510 via several bumps including a first type bump 501 and a second type bump 502 arranged in alternating order. The first type bump 501 is for connecting a transmission line 521 of the top die 520 to a transmission line 511 of the bottom die 510. The first type bump 501 is sandwiched by two small conductive pads, a top pad 523 and a bottom pad 513, having a lateral dimension substantially similar to a diameter of the bump diameter. The smaller pad size helps to reduce the interconnection capacitance. Further, the conductive pad 523 or 513 is configured to connect the corresponding top or bottom transmission line 521 or 511 via a narrower trace section 521A or 511A which gives lower capacitance and larger inductance, thereby compensating the excess capacitance caused by usage of slightly larger bump size. In a specific embodiment, the width of narrower trace section 521A or 511A shrinks to half of normal width of the transmission line 521 or 511.

The second type bump 502 is for connecting GND plane 524 of the top die 520 and GND plane 514 of the bottom die 510. As seen in FIG. 5A, the GND plane 514 has a portion cut-out to reduce the width of an extended pad 514A to roughly just the diameter of the bump 502. This structure helps to reduce the capacitance of the bump interconnection.

In a specific embodiment, referring again to FIG. 5A, the series of first and second types bumps are formed in a staggered arrangement. As shown, each of first type bumps 501 is offset each of the second type bumps 502 back and force along a nominal line (e.g., X direction). Each first type bump 501 is alternatively followed by a second type bump 502 t series of to form a 12121 configuration in a staggered style. In an example, any two nearest bumps have a pitch size P~125 μm in both X and Y direction. This staggered bump arrangement further lowers the capacitance of the bump interconnection.

Figure 6A:
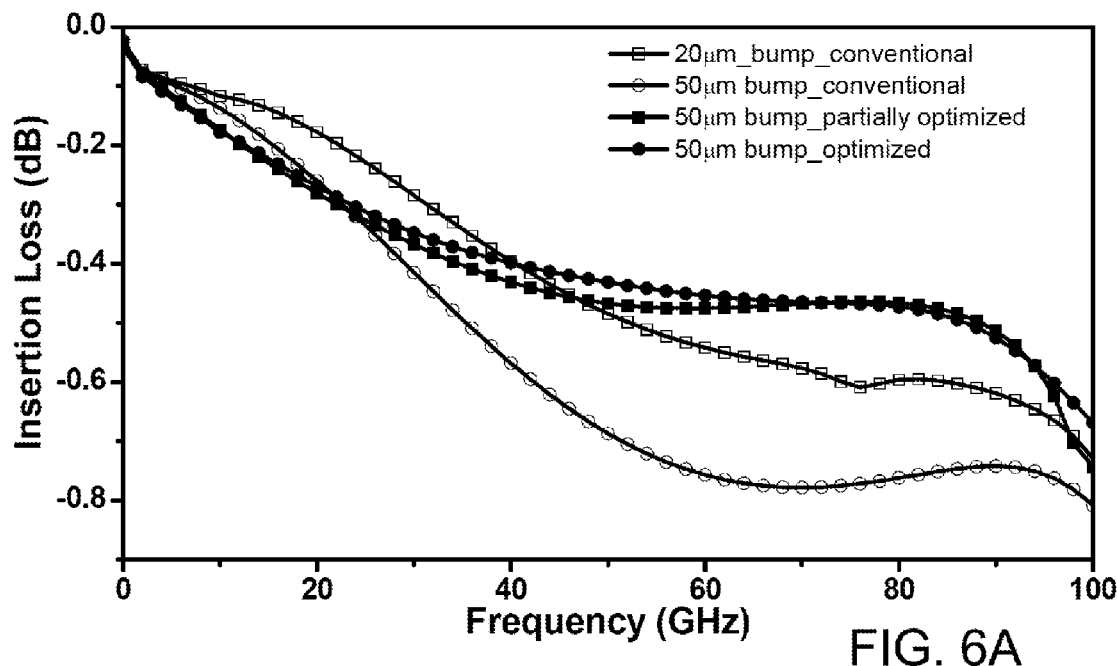
FIG. 6A is a plot of insertion loss of transmission against frequency for several bump designs according to certain embodiments of the present invention.

FIG. 6A is a plot of insertion loss of transmission against frequency for several bump designs according to certain embodiments of the present invention. This diagram is merely an example, which should not unduly limit the scope of the claims. One of ordinary skill in the art would recognize many variations, alternatives, and modifications. As shown, several bump designs are compared in terms of its impact on transmission insertion loss against the signal frequency. For conventional bump design with 50 μm sized bump, the insertion loss becomes substantially greater than 0.5 dB for signal frequency over 40 GHz. A simple reduction of bump size from 50 μm to 20 μm helps reduces the insertion loss by about 0.2 dB for signal frequency over 40 GHz, effectively increasing the bandwidth. Alternatively, using the bump size as large as 50 μm but optimized by arranging the series of bumps in staggered fashion and cutting-out GND plane under the bump achieves substantially similar performance or even lower insertion loss for signal frequency above 50 GHz. Adding another feature of shrinking trace width of transmission line connected to corresponding signal bumps further enhances the broadband transmission performance of the optical transceiver.

Figure 6B:
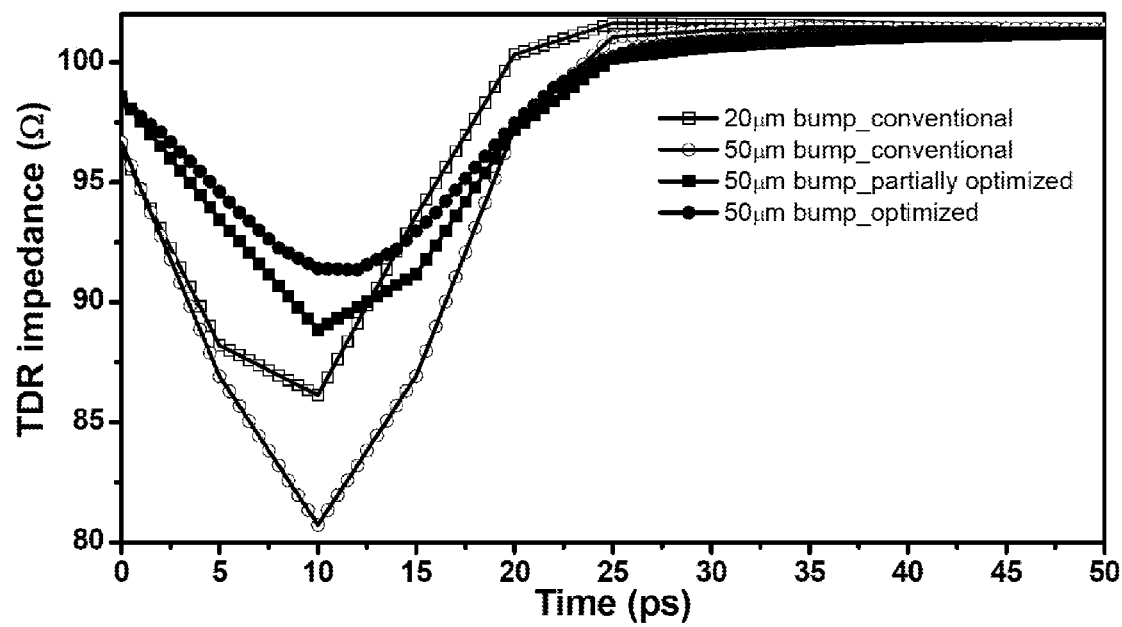
FIG. 6B is a plot of TDR impedance against settling time for several bump designs according to certain embodiments of the present invention.

FIG. 6B is a plot of TDR impedance against settling time for several bump designs according to certain embodiments of the present invention. This diagram is merely an example, which should not unduly limit the scope of the claims. One of ordinary skill in the art would recognize many variations, alternatives, and modifications. As shown, several bump designs as mentioned earlier are further compared in terms of its impact on TDR (Time-domain reflectometer) impedance of transmission signal against the time. For frequency higher than 50 GHz, the as large as 50 μm bump size design in the present invention with arrangement optimization shows better transmission performance than conventional design with 20 μm bump size but without arrangement optimization. This proves that the bump as large as 50 μm with additional staggered arrangement and optimized pitch distance proposed in this invention is not only easy for manufacturing but also provides better performance in high frequency, which is beneficial to high speed optical transceiver (>100 Gb/s) product development.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical transceiver by hybrid multichip integration comprising:
    a Si-photonics chip attached on a PCB, wherein the Si-photonics chip comprises a modulator and photo diodes embedded inside an SOI wafer and respectively coupled to multiple first conductive pads and multiple second conductive pads formed on a top surface of the SOI wafer;
    a first TSV interposer and a second TSV interposer separately attached nearby the Si-photonics chip on the PCB;
    a driver chip flip-bonded partially on the Si-photonics chip through a first sets of bumps and partially on the first TSV interposer through a second sets of bumps;
    wherein the first set of bumps comprises one or more first signal bumps alternatively arranged with one or more first ground bumps in a staggered manner along a nominal direction, each first signal bump being soldered to one of the first conductive pads connected to a first transmission line on the Si-photonics chip and each first ground bump being soldered to a neighboring one of the first conductive pads connected to a first GND plane on the Si-photonics chip, the first transmission line having a first width substantially smaller than a width of the first GND plane;
    wherein the first transmission line comprises a first trace section connected directly to the corresponding one of the first conductive pads, the first trace section having a reduced width of at least half of the first width resulting in reduced parasitic capacitance and enhanced inductance associated with the first signal bump connection between the driver chip at top to the Si-photonics chip at bottom connected to the modulator embedded therein;
    wherein the first GND plane comprises a cut-out portion around corresponding one of the first conductive pads such that the first GND plane on the Si-photonics chip substantially not overlaps with another GND plane on the driver chip, resulting in reduced parasitic capacitance and enhanced inductance associated with the first ground bump connection between the driver chip at top to the Si-photonics chip at bottom connected to the modulator embedded therein; and
    a transimpedance amplifier module chip flip-bonded partially on the Si-photonics chip through a third sets of bumps and partially on the second TSV interposer through a fourth set of bumps.

2. The optical transceiver of claim 1 wherein each of the first and second set of bumps has a first pitch distance relative to a neighboring bump along the nominal direction and a second pitch distance relative to the same neighboring bump along a perpendicular direction, the first pitch distance being substantially equal to the second pitch distance.

3. The optical transceiver of claim 2 wherein each of the first and second set of bumps comprises a diameter as large as 50 µm with each of the first pitch distance and the second pitch distance being as small as 125 µm.

4. The optical transceiver of claim 1 wherein the second set of bumps comprises one second signal bump soldered to one bond pad of the first TSV interposer connected to one or more interconnection lines for signal transmission in the PCB and one second ground bump soldered to another bond pad of the first TSV interposer connected to ground line in the PCB.

5. The optical transceiver of claim 1 wherein the third set of bumps comprises one or more third signal bumps alternatively arranged with one or more third ground bumps in a staggered manner along a nominal direction, each third signal bump being soldered to one of the second conductive pads connected to a second transmission line on the Si-photonics chip and each third ground bump being soldered to a neighboring one of the second conductive pads connected to a second GND plane on the Si-photonics chip, the second transmission line having a second width substantially smaller than a width of the second GND plane.

6. The optical transceiver of claim 5 wherein the second transmission line comprises a second trace section connected directly to the corresponding one of the second conductive pads, the second trace section having a reduced width of at least half of the second width resulting in reduced parasitic capacitance and enhanced inductance associated with the third signal bump connection between the transimpedance amplifier module chip at top to the Si-photonics chip at bottom connected to the photo diodes embedded therein.

7. The optical transceiver of claim 5 wherein the second GND plane comprises a cut-out portion around corresponding one of the second conductive pads such that the second GND plane on the Si-photonics chip substantially not overlaps with another GND plane on the transimpedance amplifier module chip, resulting in reduced parasitic capacitance and enhanced inductance associated with the third ground bump connection between the transimpedance amplifier module chip at top to the Si-photonics chip at bottom connected to the photo diodes embedded therein.

8. The optical transceiver of claim 5 wherein each of the third and fourth set of bumps has a third pitch distance relative to a neighboring bump along the nominal direction and a fourth pitch distance relative to the same neighboring bump along a perpendicular direction, the third pitch distance being substantially equal to the fourth pitch distance.

9. The optical transceiver of claim 8 wherein each of the third and fourth set of bumps comprises a diameter as large as 50 µm with each of the first pitch distance and the second pitch distance being as small as 125 µm.

10. The optical transceiver of claim 1 wherein the Si-photonics chip further comprises multiple third conductive pads formed on the top surface configured to attach one or more laser diodes and respectively wire bonded to the PCB to receive DC current injections.

11. The optical transceiver of claim 10 wherein the Si-photonics chip further comprises multiple suspended couplers, some of the multiple suspended couplers being configured to couple with outputs of one or more laser diodes and others of the multiple suspended couplers being configured to couple with one or more optical fibers.

12. The optical transceiver of claim 1 further comprising a PAM4 encoder, a PAM4 decoder, and multiple AC coupling capacitors, respectively bonded on the PCB without any wire bonds.

13. The optical transceiver of claim 1 wherein each of the first TSV interposer and the second TSV interposer is fabricated using a high-resistance silicon substrate or glass substrate completely independent of the Si-photonics chip.

14. A method for assembling a compact optical transceiver by hybrid multi-chip integration, the method comprising:
    providing a Si-photonics chip comprising at least multiple optical passives, modulators, and photo diodes embedded below a top surface thereof;
    disposing the Si-photonics chip on a PCB while having the top surface configured with at least multiple first conductive pads and second conductive pads respectively coupled to the modulators and photo diodes, wherein the multiple first/second conductive pads comprise an alternating arrangement of a signal pad followed by a ground pad, each signal pad being connected to a signal transmission line via a trace section with a reduced width and each ground pad being extended to a ground plane having a portion cut-out to substantially avoid overlapping with corresponding ground plane on a chip bonded from above;

disposing a first TSV interposer and a second TSV interposer respectively bonded on two portions of the PCB substantially nearby the Si-photonics chip, the first/second TSV interposer having respective bond pads facing up;

providing a driver module chip with a first set of bumps and a second set of bumps being pre-fabricated on front surface thereof;

flipping the driver module chip with the first set of bumps and the second sets of bumps facing down respectively bonded onto the multiple first conductive pads and corresponding bond pads of the first TSV interposer without any wire bonds;

providing a transimpedance amplifier module chip with a third set of bumps and a fourth set of bumps being pre-fabricated on front surface thereof; and flipping the transimpedance amplifier module chip with the third set of bumps and the fourth set of bumps facing down respectively bonded on the multiple second conductive pads and corresponding bond pads of the second TSV interposer without any wire bonds.

15. The method of claim 14 wherein the Si-photonics chip comprises multiple third conductive pads on the top surface and multiple first suspended couplers and second suspended couplers.

16. The method of claim 15 further comprising attaching one or more laser diodes respectively on multiple third conductive pads, coupling output ports of the one or more laser diodes to respective first suspended couplers, and connecting each of the multiple pads to the PCB by wire bonds.

17. The method of claim 15 further comprising attaching multiple optical fibers respectively to the second suspended couplers to form multiple optical output ports.

18. The method of claim 14 wherein providing a driver module chip comprises arranging the first set of bumps and the second set of bumps in a staggered manner along a nominal direction with each bump size as large as 50 µm and a first bump pitch distance along the nominal direction and a second bump pitch distance along a perpendicular direction being as small as 125 µm.

19. The method of claim 14 wherein providing a transimpedance amplifier module chip comprises arranging the third set of bumps and the fourth set of bumps in a staggered manner along a nominal direction with each bump size as large as 50 µm and a third bump pitch distance along the nominal direction and a fourth bump pitch distance along a perpendicular direction being as small as 125 µm.

20. The method of claim 14 wherein each of the first TSV interposer and the second TSV interposer is fabricated using a high-resistance silicon substrate or glass substrate completely independent of the Si-photonics chip.

21. The method of claim 14 further comprising bump bonding a PAM4 encoder, a PAM4 decoder, multiple AC coupling capacitors, and other ICs respectively on the PCB without any wire bonds.

22. An optical transceiver by hybrid multichip integration comprising:

a Si-photonics chip attached on a PCB, wherein the Si-photonics chip comprises a modulator and photo diodes embedded inside an SOI wafer and respectively coupled to multiple first conductive pads and multiple second conductive pads formed on a top surface of the SOI wafer;

a first TSV interposer and a second TSV interposer separately attached nearby the Si-photonics chip on the PCB;

a driver chip flip-bonded partially on the Si-photonics chip through a first sets of bumps and partially on the first TSV interposer through a second sets of bumps; and a transimpedance amplifier module chip flip-bonded partially on the Si-photonics chip through a third sets of bumps and partially on the second TSV interposer through a fourth set of bumps;

wherein the third set of bumps comprises one or more third signal bumps alternatively arranged with one or more third ground bumps in a staggered manner along a nominal direction, each third signal bump being soldered to one of the second conductive pads connected to a second transmission line on the Si-photonics chip and each third ground bump being soldered to a neighboring one of the second conductive pads connected to a second GND plane on the Si-photonics chip, the second transmission line having a second width substantially smaller than a width of the second GND plane; and wherein the second GND plane comprises a cut-out portion around corresponding one of the second conductive pads such that the second GND plane on the Si-photonics chip substantially not overlaps with another GND plane on the transimpedance amplifier module chip, resulting in reduced parasitic capacitance and enhanced inductance associated with the third ground bump connection between the transimpedance amplifier module chip at top to the Si-photonics chip at bottom connected to the photo diodes embedded therein.

\* \* \* \* \*